United States Patent [19]

Modic et al.

[11] Patent Number: 4,640,739
[45] Date of Patent: Feb. 3, 1987

[54] PROCESS OF PRODUCING GALVANIC LAYERS OF SOLDER OF PRECISE CONTOUR ON INORGANIC SUBSTRATES

[75] Inventors: Fedor Modic; Wolfgang Leibfried, both of Leonberg; Manfred Nitsch, Schwieberdingen; Kurt Spitzenberger, Weil der Stadt; Herbert Zimmermann, Freiberg, all of Fed. Rep. of Germany

[73] Assignee: Robert Bosch GmbH, Stuttgart, Fed. Rep. of Germany

[21] Appl. No.: 765,815

[22] Filed: Aug. 15, 1985

[30] Foreign Application Priority Data

Aug. 16, 1984 [DE] Fed. Rep. of Germany ....... 3430001
Sep. 11, 1984 [DE] Fed. Rep. of Germany ....... 3433251

[51] Int. Cl.$^4$ .......................... C23F 1/02; C25D 5/02; B44C 1/22
[52] U.S. Cl. ................. 156/659.1; 156/655; 156/666; 156/667
[58] Field of Search ...................... 156/659.1, 660, 655, 156/666, 667

[56] References Cited

U.S. PATENT DOCUMENTS 4,024,631 5/1977 Castillero ...................... 156/659.1
4,420,365 12/1983 Lehrer ............................. 156/659.1
4,487,654 12/1984 Coppin ................................ 156/666

FOREIGN PATENT DOCUMENTS 2942249 5/1981 Fed. Rep. of Germany .

Primary Examiner—Arthur Kellogg
Attorney, Agent, or Firm—Frishauf, Holtz, Goodman & Woodward

[57] ABSTRACT

Very fine solder-coated conduction paths are made on ceramic, glass or enamel substrates by the combination of a first step in thick-film technology followed by the photo-masking and etching steps typical of thin-film technology, after which galvanic reinforcement of the initial calcined copper paste layer is performed in the locations where the initial layer is exposed by the developed mask. A lead-tin solder layer is then galvanically deposited, which is thicker than the mask, after which the mask is removed and the newly exposed portions of the initial copper layer are etched away. A reflow treatment of the solder layer pattern consolidates the solder layer by melting on top of the boundaries of the un-etched initial copper layer. It is possible to obtain conduction path spacings down to 50 μm with conduction paths coated with solder that have excellent adhesion to ceramic, glass or enamel substrates.

15 Claims, 7 Drawing Figures

PROCESS OF PRODUCING GALVANIC LAYERS OF SOLDER OF PRECISE CONTOUR ON INORGANIC SUBSTRATES

This invention concerns a process for producing solder layers in the form of islands and paths on an inorganic substrate with a degree of precision meeting the requirements of the electronic industry.

It is known that in the case of printed circuits produced by thick-film technology, the spacing between the conductor paths may not be smaller than about 0.2 mm, since otherwise contacts between individual conduction paths occur too easily. On the other hand, it is known that printed circuits produced by thin-film technology make possible spacings between the conductor paths smaller than 0.1 mm. In this connection it is also known, for producing conductor paths, to coat the substrates first with a nickel and/or copper layer from 0.5 to 5 μm thick by electroless deposition and then to reinforce this layer with a galvanically deposited copper layer from 5 to 40 μm thick. This process is indeed relatively economical, but it has the great disadvantage, however, that the metal layers deposited electrochemically (electroless) on substrates of ceramic, glass or enamel adhere in general very poorly to the substrate and that in the following galvanic treatment the durability of adherence can decline still further.

It is also known to coat the substrate first by layers of copper, nickel, silver, etc., from 0.05 to 0.5 μm thick by vacuum deposition or sputtering and then to reinforce these first by electroless deposition and then galvanically to a total thickness of 10 to 45 μm. This process usually results with better adherence than the process first mentioned, but it substantially increases the cost and complication of the process as a whole.

SUMMARY OF THE INVENTION

It is an object of the present invention to provide a better method of producing conducting paths or islands on inorganic substrates such as ceramic, glass or enamel, if possible conducting paths or areas having an outer layer of solder, which durably adhere to the substrate and are economically producible.

Briefly, the substrate is first coated overall with an adhesion and conduction layer of conducting copper paste which is then calcined to fix it in place, after which a photoresist layer is applied, illuminated under and through a negative having the desired pattern, developed and hardened, after which the parts of the adhesion and conduction layer not covered by the developed and hardened photoresist, are reinforced galvanically, preferably with copper, after which a solder layer preferably of tin-lead solder is galvanically deposited on the previously galvanically reinforced regions. Thereafter, the photoresist layer is removed, the copper conducting layer at the locations that were covered by the photoresist layer are etched away, and finally the solder layer is melted in place, to shape itself by surface tension, a so-called "reflow" treatment.

By the combination of thick-film technology and photoresist masking, it is thus found directly possible to obtain conducting path spacings down to about 50 μm in spite of the presence of a solder coating.

It is particularly advantageous to use conducting copper pastes which contain copper powder and a dispersing agent, as well as copper oxide in the form of $Cu_2O$ and/or $CuO$ and a glass powder, or else copper oxide in the form of $Cu_2O$ and/or $CuO$ and lead oxide and in both cases just mentioned, also bismuth oxide. Such conducting pastes are commerically available. It is also advantageous for the galvanic reinforcement to consist of copper and the galvanically deposited solder layer to consist of tin-lead alloy of eutectic composition.

BRIEF DESCRIPTION OF THE DRAWINGS

The invention is further described by way of illustrative example with reference to the annexed drawing illustrating the successive steps of the method of the invention, and in which.

DESCRIPTION OF THE ILLUSTRATED EMBODIMENT

Figure 1:
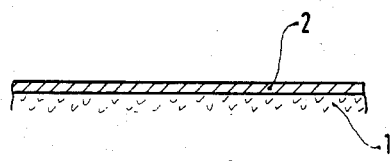
FIG. 1 is a schematic cross-section of a portion of substrate and a first layer thereon performed by the first step of the process of the invention.

As shown in FIG. 1, a substrate 1 consisting for example of an aluminum oxide ceramic material is completely coated with a commerically available conducting copper paste by a screen printing process in order to begin the production of a circuit path pattern on that substrate. This paste applied as an adhesion promoting and conducting layer, is applied onto the substrate in such a thickness that after calcination a thickness of about 8 μm remains. The calcining of this conductive paste takes place at from 900° to 950° C. in an inert gas consisting of nitrogen, for example. The calcined conducting layer is shown at 2 in FIG. 1.

Figure 2:
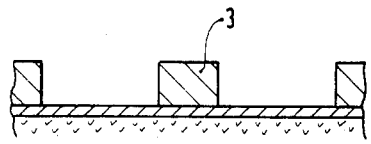
FIG. 2 is a schematic cross-section of the same substrate after the second step of the process.
Figure 3:
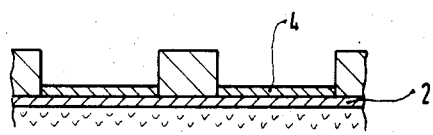
FIG. 3 is a schematic cross-section of the same substrate after a third step of the process.

A photoresist film of a thickness of about 38 μm is then applied on top of the calcined layer 2 of FIG. 1 and, on top of the photoresist there is placed a negative of the desired pattern, after which the assembly is then illuminated to expose the photoresist through the negative. Developing and subsequent hardening of the photoresist is performed in the usual way for the production of photoresist masks of the kind used for selective etching, diffusing, etc. In this manner there is produced the photoresist mask 3 shown in cross-section in FIG. 2.

In the next step the resulting structure is put in a galvanic copper-plating bath in order to apply a galvanic copper layer 4 at places not covered by the photoresist pattern. This electroplated copper layer has a thickness of about 7 μm, so that the layers 2 and 4 together have a thickness of about 15 μm.

Figure 4:
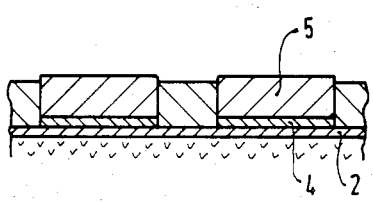
FIG. 4 is a schematic cross-section of the same substrate after a fourth step of the process.

Instead of a galvanic copper layer as above described, it is equally possible and suitable to provide a galvanic nickel layer (2-5 μm) or to deposit a combination of copper and nickel in the order just mentioned. In the next step of the process a solder layer of a thickness of about 35 μm is applied by depositing from a galvanic bath. This electroplated solder layer consists of lead and tin in a proportion corresponding to the contemporary solder electroplating standard. In can be deposited as an alloy of approximately eutectic composition or else as a combination of an alloy layer and a tin or lead layer. FIG. 4 shows the solder layer 5 plated on top of the electroplated copper layer 4.

Figure 5:
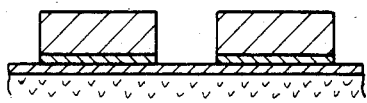
FIG. 5 is a schematic cross-section of the same substrate after the fifth step of the process.

Since the photographic masking 3 is substantially thicker than the copper layer 4, the tin-lead layer 5 is produced, as shown in FIG. 4, with sharp contours. The next step is to remove the photoresist mask 3 to produce the result shown in FIG. 5. This step can be performed either by using organic solvents in a known way or else, if the photoresist film can be stripped in alkaline solution, by removing the mask with alkali as described in German Pat. No. 29 42 249, the contents of which are hereby incorporated by reference.

Figure 6:
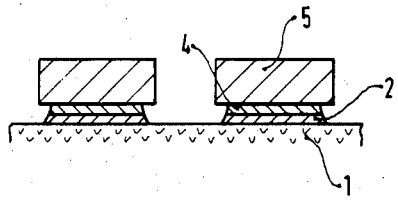
FIG. 6 is a schematic cross-section of the same substrate after the sixth step of the process.

Next, the calcined copper paste layer 2 is etched away at the places where the photoresist mask was previously located. In this step, the results of which are shown in FIG. 6, the tin-lead layer 5 operates as an etch-resist when an ammoniacal etching solution is used, as is conventional for removing copper from printed circuit boards to etch out a pattern. This solder resist layer is somewhat undercut by etching, so the resist layer 5 serving as a solder layer somewhat overhangs the superposed copper layers 2 and 4.

Figure 7:
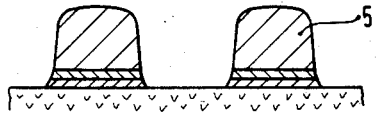
FIG. 7 is a schematic cross-section of the same substrate after a seventh and final step of the process.

The final step, however, produces a cross-section shown in FIG. 7 by melting the tin-lead layer, preferably in a solder reflow channel or chamber under a protective gas atmosphere. The conducting path pattern that results thus exhibits very sharp contours which surprisingly illustrates that it is possible, by a combination of a thick film and its galvanic reinforcement following intermediate photoresist masking to produce very finely defined conductor paths with spacing between conduction paths all the way down to about 50 μm, with the much more easily handled thick-film technology used in the first step serving to make these results remarkably economical.

Although the invention has been described with reference to a particular illustrative example, it will be understood that variations and modifications are possible within the inventive concept.

We claim:

1. Process for producing contoured solder layers overlying a copper layer on a surface of an inorganic substrate which is an electrical insulator composed predominantly of oxide material, comprising the steps of:
    applying over an entire surface of said substrate, and then calcining, a conducting copper paste to form a conducting and adhesion-promoting copper first layer (2) on said substrate;
    superposing on said copper layer a photoresist film (3) and a negative image film of a desired pattern on top of said photoresist film, followed by exposing said photoresist film, through said negative image film, to illumination, developing said photoresist film and hardening the same in said desired pattern;
    galvanically reinforcing the portion of said copper first layer not covered by said photoresist film with at least one layer (4) of a conducting layer composed of metallic material selected from the group which consists of copper and nickel;
    galvanically depositing, on top of said at least one reinforcing layer, a layer (5) of lead-tin solder;
    removing said hardened photoresist film;
    etching away said copper first layer in the locations where said hardened photoresist film was removed, and
    melting said solder layer for conforming its contour to the underlying unetched remainder of said copper first layer.

2. Process according to claim 1, in which said conducting copper paste is composed of powdered copper, a dispersing agent, powdered glass and copper oxide in the form of a substance selected from the group consisting of $Cu_2O$, $CuO$ and mixtures of $Cu_2O$ and $CuO$.

3. Process according to claim 1, in which said conducting copper paste is composed of powdered copper, a dispersing agent, PbO and copper oxide in the form of a substance selected from the group consisting of $Cu_2O$ and $CuO$ and mixtures of $Cu_2O$ and $CuO$.

4. Method according to claim 1, in which said conducting copper paste is composed of powdered copper, a dispersing agent, glass powder, bismuth oxide and copper oxide in the form of a substance selected from the group consisting of $Cu_2O$ and $CuO$ and mixtures of $Cu_2O$ and $CuO$.

5. Process according to claim 1, in which said conducting copper paste is composed of powdered copper, a dispersing agent, PbO, bismuth oxide and copper oxide in the form of a substance selected from the group consisting of $Cu_2O$ and $CuO$ and mixtures of $Cu_2O$ and $CuO$.

6. Process according to claim 1, in which said conducting copper paste is applied on said substrate in such a thickness that after calcining said copper first layer as a thickness of from 5 to 12 μm.

7. Process according to claim 6, in which said conducting copper paste is applied on said substrate by screen printing.

8. Process according to claim 1, in which the calcining of said conducting copper paste is carried out in a nitrogen atmosphere at a temperature in the range from 900° to 950° C.

9. Process according to claim 1, in which said photoresist film (3) has a thickness in the range from 25 to 70 μm.

10. Process according to claim 1, in which said at least one layer reinforcing said copper first layer has a thickness in the range from 3 to 12 μm.

11. Process according to claim 1, in which said layer of lead-tin solder has a thickness in the range from 20 to 60 μm.

12. Process according to claim 1, in which the step of removing said photoresist film is performed by dissolving it away in an organic liquid.

13. Process according to claim 1, in which said photoresist film is a film which is strippable by means of an alkaline reagent and in which the step of removing said photoresist film is carried out stripping by means of an alkali metal hydroxide solution.

14. Process according to claim 1, in which the step of etching away said copper first layer in the locations where said hardened photoresist film was removed is performed with an ammoniacal etching solution, while said galvanically deposited solder layer functions as an etch-resist.

15. Process according to claim 1, in which the step of melting said solder layer is carried out in a protective gas atmosphere.

* * * * *